United States Patent
Doerrer et al.

(10) Patent No.: US 6,909,394 B2
(45) Date of Patent: Jun. 21, 2005

(54) QUANTIZER FOR A SIGMA DELTA MODULATOR, AND SIGMA DELTA MODULATOR

(75) Inventors: Lukas Doerrer, Villach (AT); Antonio Di Giandomenico, Villach (AT); Andreas Wiesbauer, Pörtschach (AT)

(73) Assignee: Infineon Technologies AG, München (DE)

( * ) Notice: Subject to any disclaimer, the term of this patent is extended or adjusted under 35 U.S.C. 154(b) by 12 days.

(21) Appl. No.: 10/692,628

(22) Filed: Oct. 24, 2003

(65) Prior Publication Data

US 2004/0145504 A1 Jul. 29, 2004

(30) Foreign Application Priority Data

Nov. 22, 2002 (DE) .......................................... 102 54 651

(51) Int. Cl.[7] .............................................. H03M 1/12
(52) U.S. Cl. ........................................ 341/200; 341/155
(58) Field of Search ................................. 341/122, 143, 341/155, 144, 200

(56) References Cited

U.S. PATENT DOCUMENTS

| | | | |
|---|---|---|---|
| 5,117,234 A | 5/1992 | Shizawa | 341/143 |
| 5,227,795 A * | 7/1993 | Yamakido et al. | 341/166 |

* cited by examiner

*Primary Examiner*—Peguy JeanPierre
(74) *Attorney, Agent, or Firm*—Jenkins, Wilson & Taylor, P.A.

(57) ABSTRACT

The invention relates to a quantizer (1) for a sigma delta modulator (10) having at least one input stage (2), the quantizer quantizing an input signal (21) present at its input stage in accordance with at least one threshold signal and outputting it as result value (22) at a digital result output (23). Furthermore, the invention relates to a sigma delta modulator having such a quantizer.

23 Claims, 8 Drawing Sheets b3=1/2

| IN_DAC<0:6> | dat | sel7 | sel6 | sel5 | sel4 | sel3 | sel2 | sel1 | sel0 |
|---|---|---|---|---|---|---|---|---|---|
| =0000000 | 0 | 1 | 0 | 0 | 0 | 0 | 0 | 0 | 0 |
| =0000001 | 1 | 0 | 1 | 0 | 0 | 0 | 0 | 0 | 0 |
| =0000011 | 2 | 0 | 0 | 1 | 0 | 0 | 0 | 0 | 0 |
| =0000111 | 3 | 0 | 0 | 0 | 1 | 0 | 0 | 0 | 0 |
| =0001111 | 4 | 0 | 0 | 0 | 0 | 1 | 0 | 0 | 0 |
| =0011111 | 5 | 0 | 0 | 0 | 0 | 0 | 1 | 0 | 0 |
| =0111111 | 6 | 0 | 0 | 0 | 0 | 0 | 0 | 1 | 0 |
| =1111111 | 7 | 0 | 0 | 0 | 0 | 0 | 0 | 0 | 1 | b3=1/2

|  | NOM (if b3=0) | dat=0 −7/14 | dat=1 −5/14 | dat=2 −3/14 | dat=3 −1/14 | dat=4 +1/14 | dat=5 +3/14 | dat=6 +5/14 | dat=7 +7/14 |
|---|---|---|---|---|---|---|---|---|---|
| Vth1 | +6/7 | +5/14 | +7/14 | +9/14 | +11/14 | +13/14 | +15/14 | +17/14 | +19/14 |
| Vth2 | +4/7 | +1/14 | +3/14 | +5/14 | +7/14 | +9/14 | +11/14 | +13/14 | +15/14 |
| Vth3 | +2/7 | −3/14 | −1/14 | +1/14 | +3/14 | +5/14 | +7/14 | +9/14 | +11/14 |
| Vth4 | 0 | −7/14 | −5/14 | −3/14 | −1/14 | +1/14 | +3/14 | +5/14 | +7/14 |
| Vth5 | −2/7 | −11/14 | −9/14 | −7/14 | −5/14 | −3/14 | −1/14 | +1/14 | +3/14 |
| Vth6 | −4/7 | −15/14 | −13/14 | −11/14 | −9/14 | −7/14 | −5/14 | −3/14 | −1/14 |
| Vth7 | −6/7 | −19/14 | −17/14 | −15/14 | −13/14 | −11/14 | −9/14 | −7/14 | −5/14 |

FIG. 9

QUANTIZER FOR A SIGMA DELTA MODULATOR, AND SIGMA DELTA MODULATOR

DESCRIPTION

1. Technical Field

The invention relates to quantizers for a sigma delta modulator having at least one input stage, where the quantizer quantizes an input signal, which is present at its input stage, in accordance with at least one threshold signal, and outputs it as a result value to a digital result output, and to a sigma delta modulator having such a quantizer.

2. Background Art

In recent years, sigma delta ($\Sigma\Delta$) modulation has gained increasing importance in the field of analog/digital (A/D) and digital/analog (D/A) conversion. This is mainly attributable to the low demands made on the analog components of $\Sigma\Delta$ converters. Digital circuits are currently gaining more and more in importance in signal processing. To be able to convert signals from the analog environment and then to be able to process them digitally, A/D converters are necessary. It is desirable to integrate converter and the remaining digital circuit on a single chip. Since in most cases the digital part dominates the chip area, this also determines the circuit technology. Digital process technologies, however, make it more difficult to produce precise analog integrated circuit components which require very high accuracies and small production tolerances. This is where the simplicity and robustness of analog components of the sigma delta modulators becomes effective as a result of which sigma delta converters are predestined for implementations in, for example, digital VLSI technology.

A further advantage of the sigma delta modulators lies in the fact that they need less current than conventional A/D converters which also qualifies them in the important area of portable receivers. Similarly, they are distinguished by a greater signal bandwidth which makes them interesting for applications in xDSL transceiver technology.

The problem with sigma delta modulators is that, especially towards higher frequencies to be converted, excess loop delays in the individual components produce errors which restricts their application towards high frequencies (>1 GHz). The problems of excess loop delays are also discussed in: J. A. Cherry, W. M. Snelgrove, "Continuous-Time Delta-Sigma Modulator for High Speed A/D Conversion", Kluwer Academic Publishers 2000, pages 75–103.

A known way of compensating for these errors induced by delay differences is the approach known from P. Benabes, M. Keramat, R. Kielbasa, "A methodology for designing continuous-time sigma-delta modulators", IEEE European Design and Test Conference 1997, pages 45–50, of introducing an additional feedback loop (inner loop) which is formed by an additional adder between the quantizer and the last integrator preceding it.

In FIG. 1, such a continuous-time second order sigma delta modulator with two input stages $V_1$ and $V_2$ and with correction means b3 and 110 is shown. The signal x to be converted, which is present at the input IN is supplied to the quantizer 12 at its input $E_Q$ by two integrators $14_1$ and $14_2$ which are in each case preceded by an adder $13_1$ and $13_2$, respectively, where the feedback signal is coupled in. Before that, however, the signal to be quantized, again provided with the feedback signal via the adder 110 additionally arranged in the signal path, is also combined with the factor predetermined by $b_3$. This takes into consideration and compensates for the influence of the delay in the individual components. The further design can be found in J. A. Cherry, W. M. Snelgrove, "Continuous-Time Delta-Sigma Modulator for High Speed A/D Conversion", Kluwer Academic Publishers 2000, pages 75–103.

The disadvantageous factor in this arrangement is, however, that a highly accurate active component (additional adder) must be provided in the signal path, with the associated difficulties with respect to production methods and steps, layout design and rejects during the production. It is also disadvantageous that, as a result, the current consumption is considerably increased which restricts its applications especially in the case of portable applications which must save current.

SUMMARY OF THE INVENTION

It is, therefore, the object of the invention to provide a quantizer for a sigma delta modulator and a sigma delta modulator having such a quantizer in which the delays are compensated for by the individual components but no additional component is provided in the signal path.

This object is achieved by a quantizer having the features of claim 1 or of claim 13, and by a sigma delta modulator having the features of claim 24.

According to the invention, it is provided that the quantizer contains at least one quantizing cell according to the number of its resolution levels, each quantization cell exhibiting an input voltage/current converter which converts the input signal to be quantized into a corresponding input current at its output, that the at least one quantization cell is associated with a static threshold current source which supplies a static proportion of the threshold signal in the form of a static threshold current, that a dynamic feedback current source is provided which generates a feedback current derived from the digital result value, which feedback current is added to the static threshold current in a current node, that the threshold current composed of the static threshold current and the feedback current is added to the input current in the current node, that a comparison unit is provided which decides whether the accurate current present at the current node is not equal to zero and supplies a digital result accordingly.

The invention proposes to design the complete architecture of the quantizer for weighting currents. This has a tremendous advantage, in particular, if the digital/analog converter provided in any case for the feedback signal, of a signal delta modulator operates with current weightings ("current steering DAC"). For this purpose, the input signal, the information of which is contained in its signal voltage, is converted into a signal current. This current is added to a dynamic reference current which is composed of the static threshold current and the feedback current derived from the digital result value. The only decision to be made then is whether the sum of the currents is greater than zero or not.

According to the invention, the summing node is provided close to the input of the comparison unit without any further analog chip preceding it in the signal path. In addition, the layout of an integrated circuit forming such a quantizer is simplified. The processing speed of the dynamic current source for the reference current can be lower than that of the input voltage/current converter since the signal to be weighted does not pass through it. This leads to advantageous current consumption savings. As a result, the total current consumption of the system is reduced by such an amount that it becomes usable for portable, battery-operated applications without problems. In addition, the processing speed is increased which opens up uses, particularly, in applications in xDSL technology.

A preferred embodiment of the invention provides that, for obtaining the analog feedback current derived from the digital result value, a digital/analog converter is provided which supplies a voltage signal corresponding to the result value for deriving the feedback current.

The digital/analog converter is advantageously constructed in such a manner that it supplies the feedback current directly as analog output signal.

An embodiment of the invention provides that the input voltage/current converter is a transistor driven at a base input by means of the input signal.

To each quantizing cell, a threshold signal is advantageously allocated which differs from the threshold signals of other quantizing cells.

The threshold signals advantageously exhibit fixed mutual differences.

Advantageously, an amplifying stage is provided which amplifies the current at the current node before it is weighted by the comparison unit.

The comparison is advantageously provided as a latch.

According to an embodiment of the invention, it is accordingly provided that the latch exhibits a comparator and a sample-and-hold device.

A preferred embodiment of the invention provides that the quantizer is symmetrically designed with a positive and a negative signal path and, correspondingly, with a positive signal input for a positive input signal and with a negative signal input for a negative input signal.

Accordingly, a further embodiment of the invention provides that a degeneration resistor is provided between the positive and the negative signal paths.

Advantageously, a dynamic feedback current is provided for all quantizing cells.

To each quantizing cell, a separate static threshold current source is advantageously allocated.

According to a further aspect of the invention, it is provided that the quantizer is distinguished by the fact that the quantizer contains at least one quantizing cell in accordance with the number of its resolution levels, each quantizing cell exhibiting a voltage comparator which compares the input signal voltage with the threshold signal voltage and, if the input signal exceeds or drops below the threshold signal, outputs a corresponding digital result bit (0/1), a digital adder being provided which adds the digital result value of the last assessment of the comparators of the quantizer to the threshold signal voltages by incrementing or decrementing the threshold signal voltages by steps corresponding to the digital result value.

The adder is advantageously associated with a switching mechanism which exhibits switches at the input of which the part-voltages of the reference voltage generator are present and the outputs of which are connected to the inputs for the threshold signal voltages of the comparators, the switches being controlled by the output signal of the adder.

The reference voltage generator preferably generates the part voltages which can be applied for weighting the input signal by means of switches in accordance with the digital result value and/or the desired threshold signal voltage at the respective comparator.

According to an advantageous embodiment, the quantizer is symmetrically equipped with a positive and a negative signal path and correspondingly with a positive signal input for a positive input signal and with a negative signal input for a negative input signal.

A reference voltage generator is preferably provided which generates the threshold signal voltages, which are different for each voltage comparator, the threshold signal voltages being selectable in part voltages.

The comparators are advantageously formed by continuous-time voltage comparators.

A latch is preferably provided which stores the results supplied by the comparators.

The invention also relates to a sigma delta modulator having at least one input stage and having a quantizer which is constructed in accordance with one of the aforementioned variants.

Further advantages, special features and suitable developments of the invention can be obtained from the further subclaims or their subcombinations.

BRIEF DESCRIPTION OF THE DRAWINGS

In the text which follows, the invention is explained in greater detail with reference to the drawing, in which:

FIG. 9 shows a table which shows actual voltage values according to an example.

In the figures, identical reference symbols designate identical or identically operating elements.

The novel principle is the summation of the feedback signal with the threshold signals of the comparators.

Figure 1:
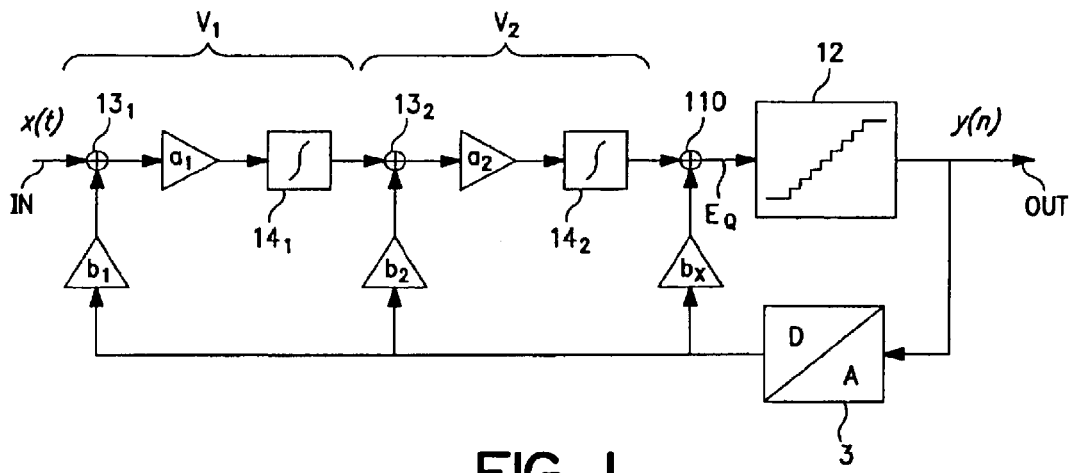
FIG. 1 shows a continuous-time sigma delta modulator according to the prior art.
Figure 2:
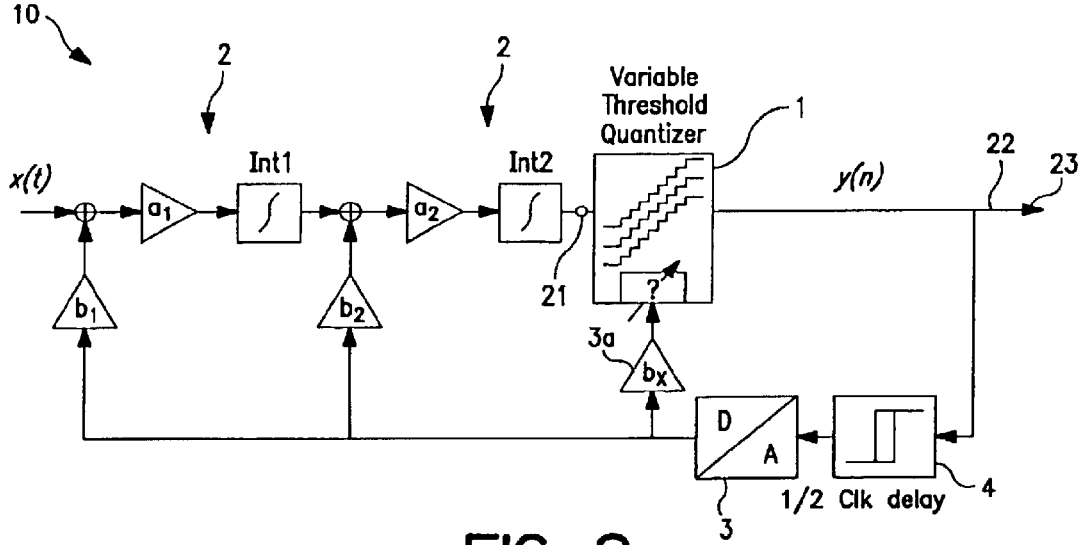
FIG. 2 shows a first embodiment of the sigma delta modulator according to the invention with a quantizer according to the invention in current mode.
Figure 3:
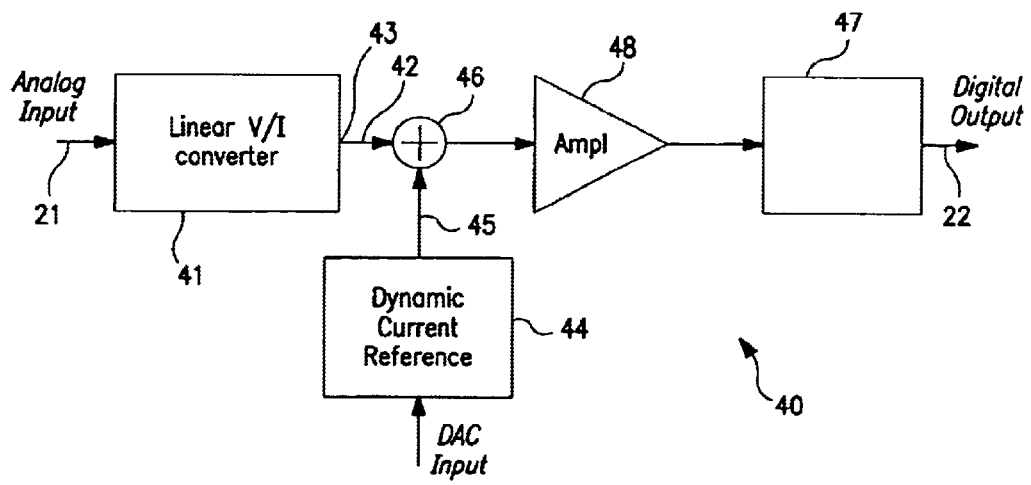
FIG. 3 shows a schematic block diagram of a quantizing cell according to a first embodiment of the invention.
Figure 4:
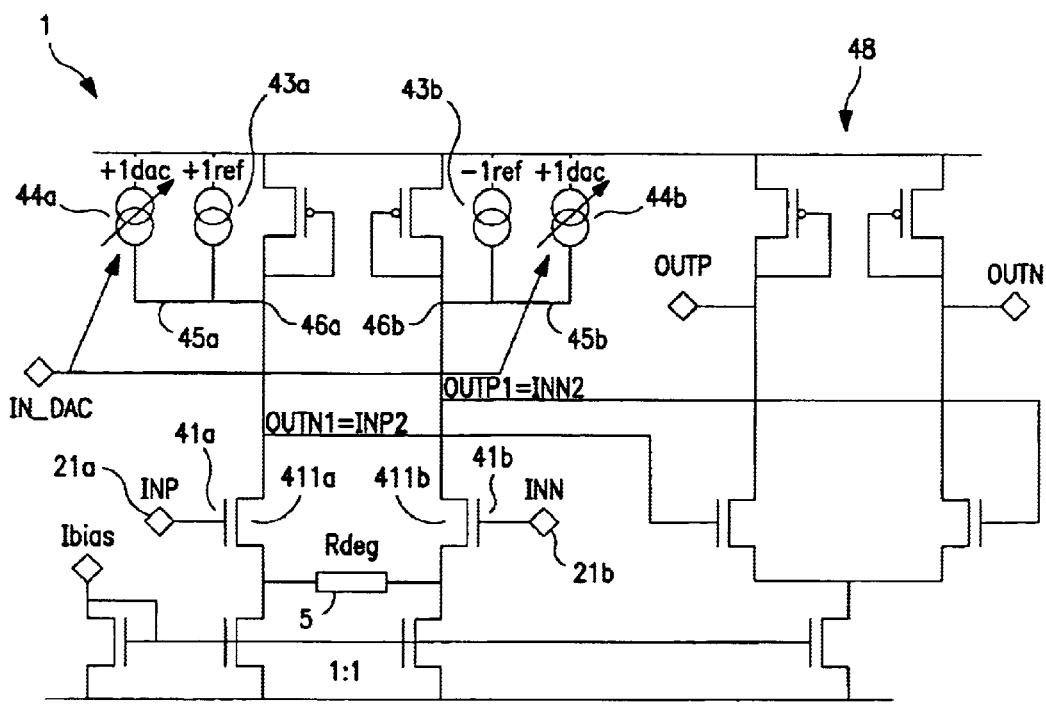
FIG. 4 shows an actual implementation of a quantizing cell from FIG. 3.

FIGS. 2 to 4 show a quantizer according to a first embodiment of the invention.

FIG. 2 shows the basic circuit diagram of a sigma delta modulator 10 according to the invention with a quantizer 1 according to the current summation principle and two input stages 2, the quantizer 1 quantizing the input signal 21 present at its input stage and outputting it as a result value 22 at a digital result output 23.

A digital/analog converter 3 is provided for obtaining the analog feedback signal, derived from the digital result value 22, for the sigma delta modulator.

The delay of 1/2 clock cycles by the delay element 4, provided for compensation, is only shown by way of example here and can vary in practice depending on the construction of the quantizer and its external circuitry. Such a delay element can be of use if the circuitry produces delay differences with different input signals and thus different results of the quantization. The delay element, which is coupled to the clock, then equalizes such delay differences. The actual embodiment of the circuit of the quantizer is accordingly adapted to the propagation delay. The matching element 3a which applies the factor b3 to the analog signal is also constructed accordingly, see also: J. A. Cherry, W. M. Snelgrove, "Continuous-Time Delta-Sigma Modulator for High Speed A/D Conversion", Kluwer Academic Publishers 2000, pages 75–103.

The decisive advantage of the invention lies in the fact that the comparison $$V_{IN} > (Vth_i + b_3 * V_{dac})$$

is performed and weighted by the individual stages (i) of the quantizer and no longer, as previously in the prior art, $$(V_{IN} - b_3 * V_{dac}) > Vth_i$$

which necessitates an active summation element in the signal path before the quantizer. Wherein $V_{IN}$: input signal, $b_3$: matching factor (for example ½), $V_{dac}$: output value of the digital/analog converter.

In the invention, matching to the previous result value is repeated dynamically with each weighting. This provides for highly accurate digitization at a very high sampling rate.

FIG. 3 diagrammatically shows a quantization cell 40 which exists in accordance with a number of resolution levels of the quantizer 1. Each quantization cell 40 has an input voltage/current converter 41 which converts the input signal 21 to be quantized into a corresponding input current 42 at its output 43.

The signal 42 thus obtained is added to the feedback current 45 in a current node 46. For this purpose, the feedback current 45 is generated by a dynamic feedback current source 44 in accordance with the digital result value 22.

The summed signal is also prepared for a latch 47 containing the comparison unit by a preamplifier 48. The latch additionally also contains a sample-and-hold stage so that the result bits can be correctly processed further.

FIG. 4 shows a preferred embodiment of the quantizer with a linear current/voltage converter 44a and 44b and a conventional gm stage.

The quantizer 1 is symmetrically provided with a positive and a negative signal path and correspondingly with a positive signal input 21a for a positive input signal and with a negative signal input 21b for a negative input signal. The two signal paths are connected to one another by means of a degeneration resistor 5 connected between the positive and the negative signal paths. Accordingly, the feedback current sources 44a and 44b, the input voltage/current converters 41a and 41b, the current nodes 46a and 46b and the threshold current threshold source 49a and 49b are constructed in duplicate.

The arrangement provides the following transconductance Gm:

$$Gm = (gm/2 * 1/Rdeg)/(gm/2 + 1/Rdeg)$$

where gm is the transconductance of the transistors 411a and 411b and Rdeg is the resistance value of the degeneration resistor 5.

The quantization cell 40 is associated with a static threshold current source 49a, 49b, again constructed in duplicate, which supplies the threshold signal corresponding to level (i) of the quantizer in the form of a threshold current Iref, the threshold current being added to the input current derived from INP and INN and to the feedback current Idac in the current nodes 46a and 46b.

The input voltage/current converter (41a and 41b) is in each case constructed by a transistor (411a and 411b) which is driven by means of the input signal at its base input.

The amplifying stage 48 is provided in order to amplify the signal of the current at the current nodes 46a, 46b before it is weighted by the comparison unit. The comparison unit 47 decides whether the amplified aggregate current is not equal to zero and supplies a digital result accordingly.

Figure 5:
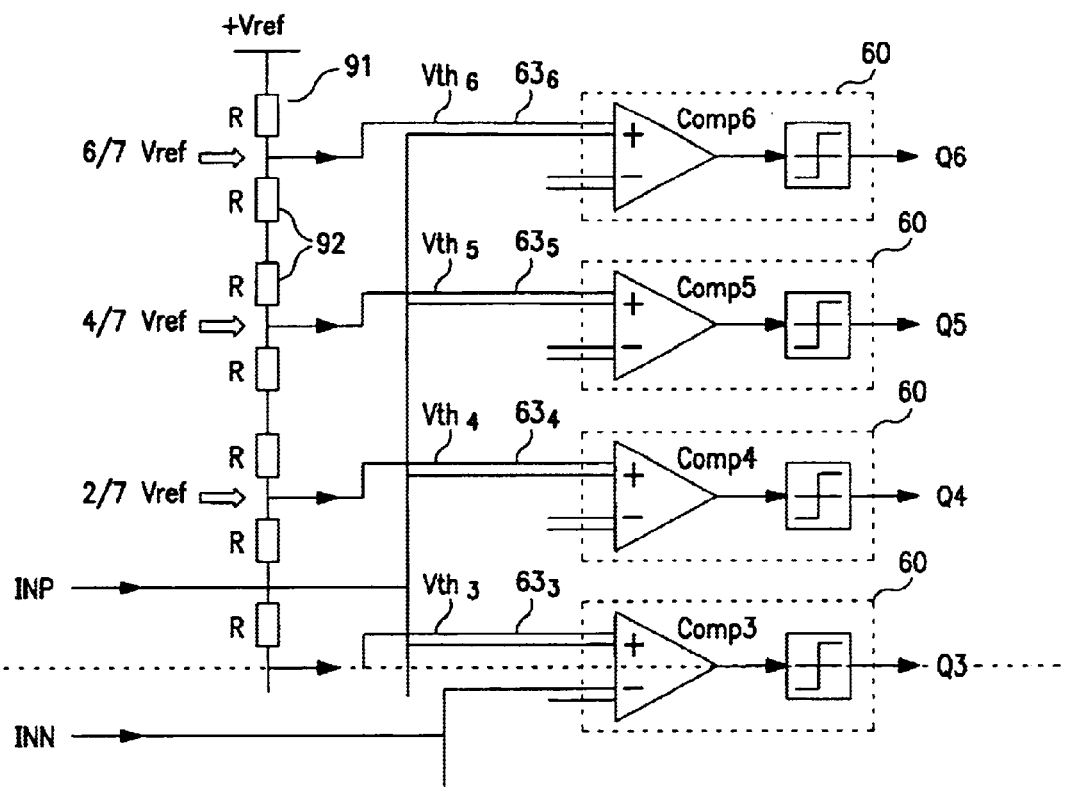
FIG. 5 shows a basic circuit diagram of a conventional quantizer operating in accordance with the principle of voltage comparison.

With respect to the principle of comparing voltages instead of comparing currents, quantizers according to the configuration shown in FIG. 5 are known.

In this arrangement, a part reference voltage having uniform differences with respect to one another is generated by means of resistors 92 arranged in a chain of resistors 91 from a voltage formed between +Vref and −Vref, which form the threshold signal voltage $63_i$ of the individual quantization cells 40.

In the example shown, the seven static threshold voltages of the comparators with respect to Vref are:

+6/7, +4/7, +2/7, 0, −2/7, −4/7, −6/7 which are supplied to the individual quantization cells 40 which then in each case compare this part reference voltage $Vth_i$ with the input signal.

The part reference voltages are fixed which is why the input signal VIN must be matched to the result $V_{dac}$ for feedback purposes. Thus, the comparison $$(V_{IN} - b_3 * V_{dac}) > Vth_i$$

is again made which again necessitates an active summation element in the signal path before the quantizer, with the aforementioned disadvantages. Wherein $V_{IN}$: input signal, $b_3$: matching factor (for example ½), $V_{dac}$: output value of the digital/analog converter.

FIGS. 5a to 10 show a quantizer 1 according to a further embodiment of the invention in which, however, a quantizer is distinguished by voltage summation.

Figure 5A:
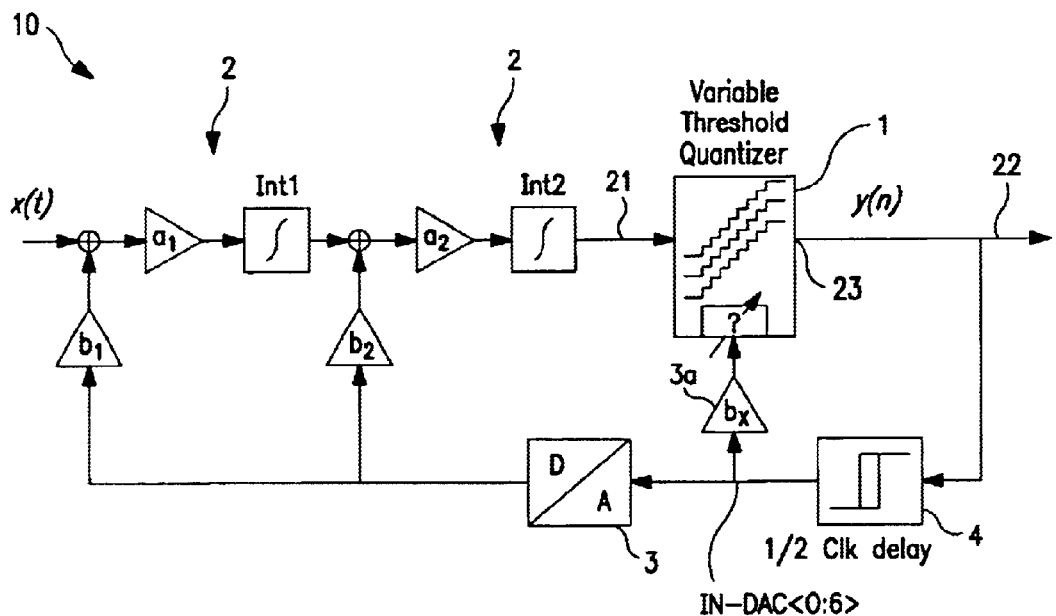
FIG. 5a shows a second embodiment of the sigma delta modulator according to the invention with a quantizer according to the invention in voltage mode.

FIG. 5a shows the rough basic configuration of the sigma delta modulator 10 with two input stages 2. Since in this case, however, voltages are processed and not currents as in the first embodiment of the invention, the analog/digital converter 3 is no longer needed in the signal path between output 23—with the result 22 present—and the quantizer 1.

Compared with the prior art, the advantages again achieve that an additional element in the signal path before the input of the quantizer can be omitted. In the quantization cells, the comparison $$V_{IN} > (Vth_i + b_3 * V_{dac})$$

is again made by the individual stages (i) of the quantizer and the result is weighted. Wherein $V_{IN}$: input signal, $b_3$: matching factor (for example ½), $V_{dac}$: result value of the previous weighting.

Figure 6:
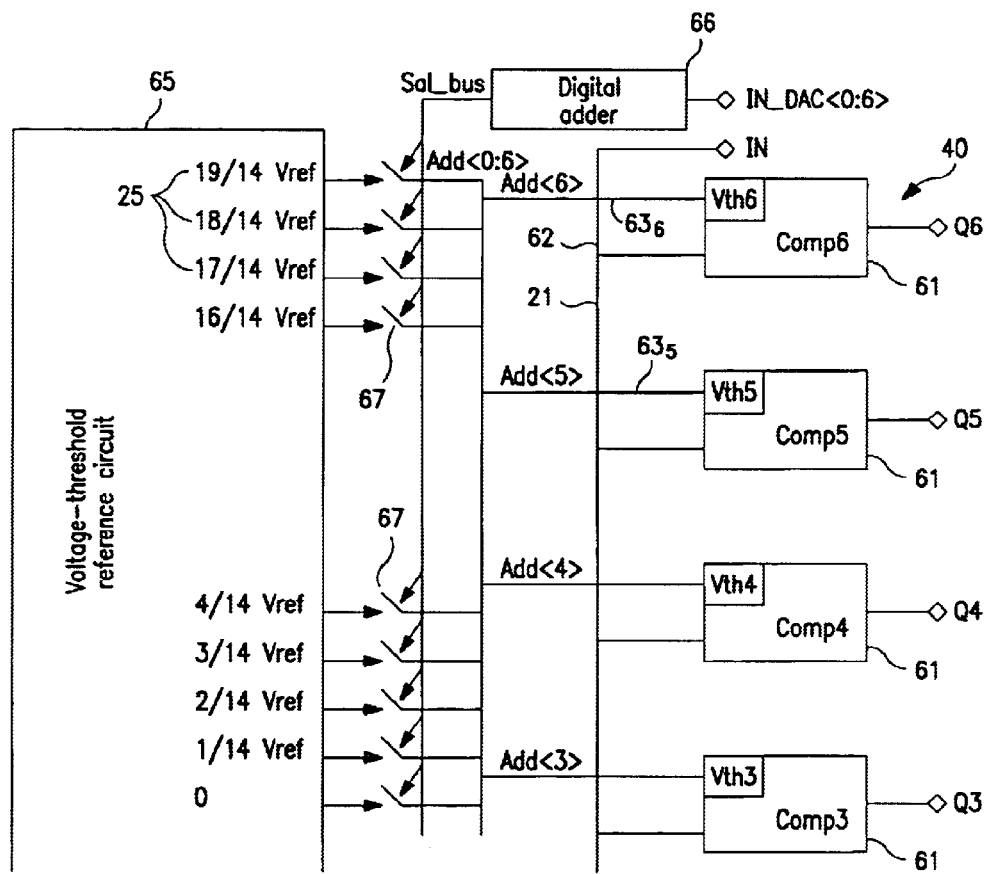
FIG. 6 shows a schematic block diagram of the quantizer in voltage mode.

FIG. 6 shows an implementation of a quantizer 1 in which the addition of the feedback value (IN_DAC<0:6>) is already made in the purely digital domain. This does not require a digital/analog converter. The part reference voltages are again generated, for example, by a chain of resistors.

A digital adder 66 is provided which adds the digital result value 22 (IN_DAC<0:6>) of the last weighting of the comparators 61 of the quantizer 1 to the threshold signal voltages by incrementing or decrementing the threshold signal voltages $63_i$ by steps corresponding to the digital result value. For this purpose, switches 67 are correspondingly opened or closed.

The matching to the delay differences by the factor $b_3$ can be done in the adder 66 itself which, according to the result of the addition with feedback value IN_DAC<0:6> (result of the previous weighting of the quantizer), switches the corresponding threshold voltages by means of the switches 67 to the individual inputs $Vth_i$ of the quantizing cells 40 which then perform the weighting with the input signal IN with respect to the respective result bit Qi.

The quantizer 1 has a number of quantizing cells 40 corresponding to the number of its resolution levels.

Each quantizing cell 40 exhibits a voltage comparator 61 which compares the input signal voltage 62 with its threshold signal voltage $63_i$ and, if the input signal exceeds or drops below the threshold signal, outputs a corresponding digital result bit (0/1) (Qi).

To generate the different threshold signal voltages $63_i$, a reference voltage generator 65 is provided which supplies each voltage comparator 61 with its own threshold signal voltage $63_i$ in accordance with the output data Add<0:6> of the adder 66 with the switches 67. The differences of the individual threshold signal voltage $63_i$ remain the same but the voltage level of each threshold signal voltage $63_i$ is increased or decreased in accordance with the result IN_DAC<0:6> of the previous weighting of the quantizer in accordance with the result Add <0:6> of the adder 66.

Thus, according to the result of the summation, part voltages 1/14* Vref, 2/14* Vref, . . . , are added to the threshold voltage $V_{th}$ by opening and closing switches and are connected to the comparators 61. In the example shown and in the text which follows, a 3-bit quantizer with seven steps is shown in which $b_3=\frac{1}{2}$ has been selected (see also the following figures). Other values and resolutions can also be implemented here.

Therefore, the seven threshold voltages of the comparators are with respect to Vref no longer fixed to the basic voltages (with respect to Vref)

+12/14, +8/14, +4/14, 0, −4/14, −8/14, −12/14 one of the following values is added with each clock cycle in accordance with the actual and instantaneous value of the result value by the digital adder 66 to all threshold voltages:

+7/14, +5/14, +3/14, +1/14, −1/14, −3/14, −5/14, −7/14 the resultant seven signals are compared by the comparators with the current input signal of the quantizer which is to be weighted, which generates the next digital result.

The arrangement of the comparators and the comparators themselves can also be designed symmetrically with a positive and a negative signal path.

Figure 7:
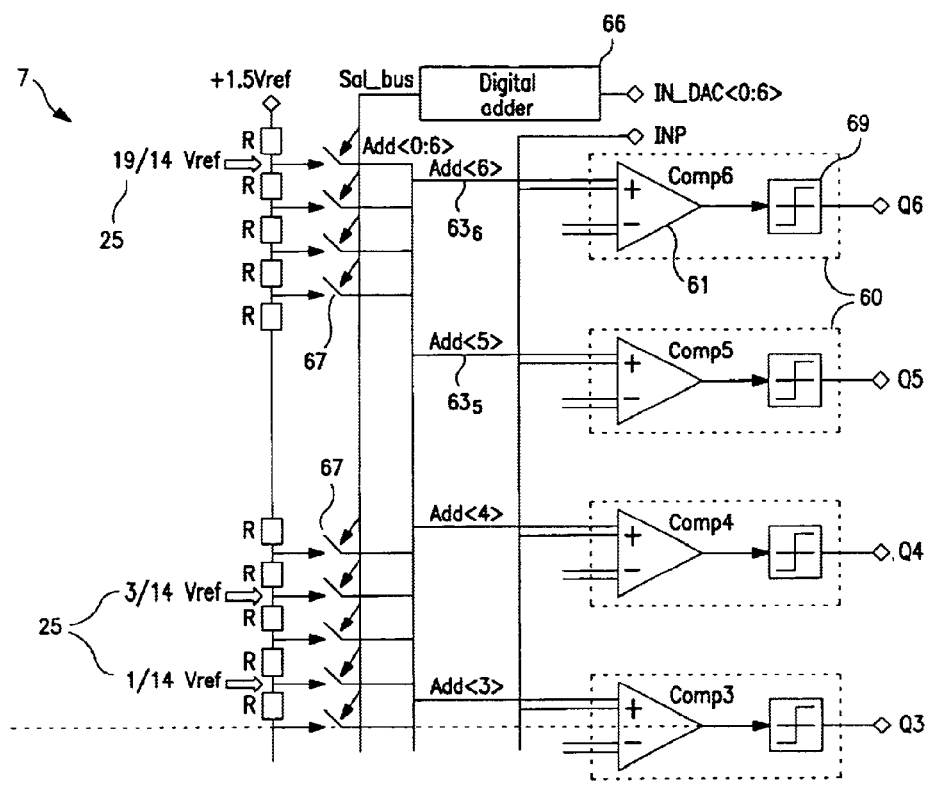
FIG. 7 shows an actual embodiment of the quantizer according to the invention with a chain of resistors for generating the individual voltages and a switching value controlled by an adder.

FIG. 7 shows a symmetric example of a quantizer 1 with a positive and a negative input (not shown). The reference voltages (threshold signals 25) are generated by a chain of resistors 68 which are connected to the quantizing cells 40 at their inputs by the switches 67 in accordance with the result IN_DAC<0:6>. The quantizing cells 40 have a symmetric comparator 61 and a latch circuit 69.

The reference voltage generator 65 in FIG. 7 is formed by means of a chain of resistors 68 which divides the voltage between +Vref and −Vref into a large number of part threshold signal voltages which are applied at the respective comparator 61 for weighting the input signal in accordance with the digital result value and/or the desired threshold signal voltage by means of switches 67.

The quantizer is again constructed symmetrically with a positive and a negative signal path and correspondingly with a positive signal input (+) for a positive input signal (INP) and with a negative signal input (−) for a negative input signal.

Figure 8:
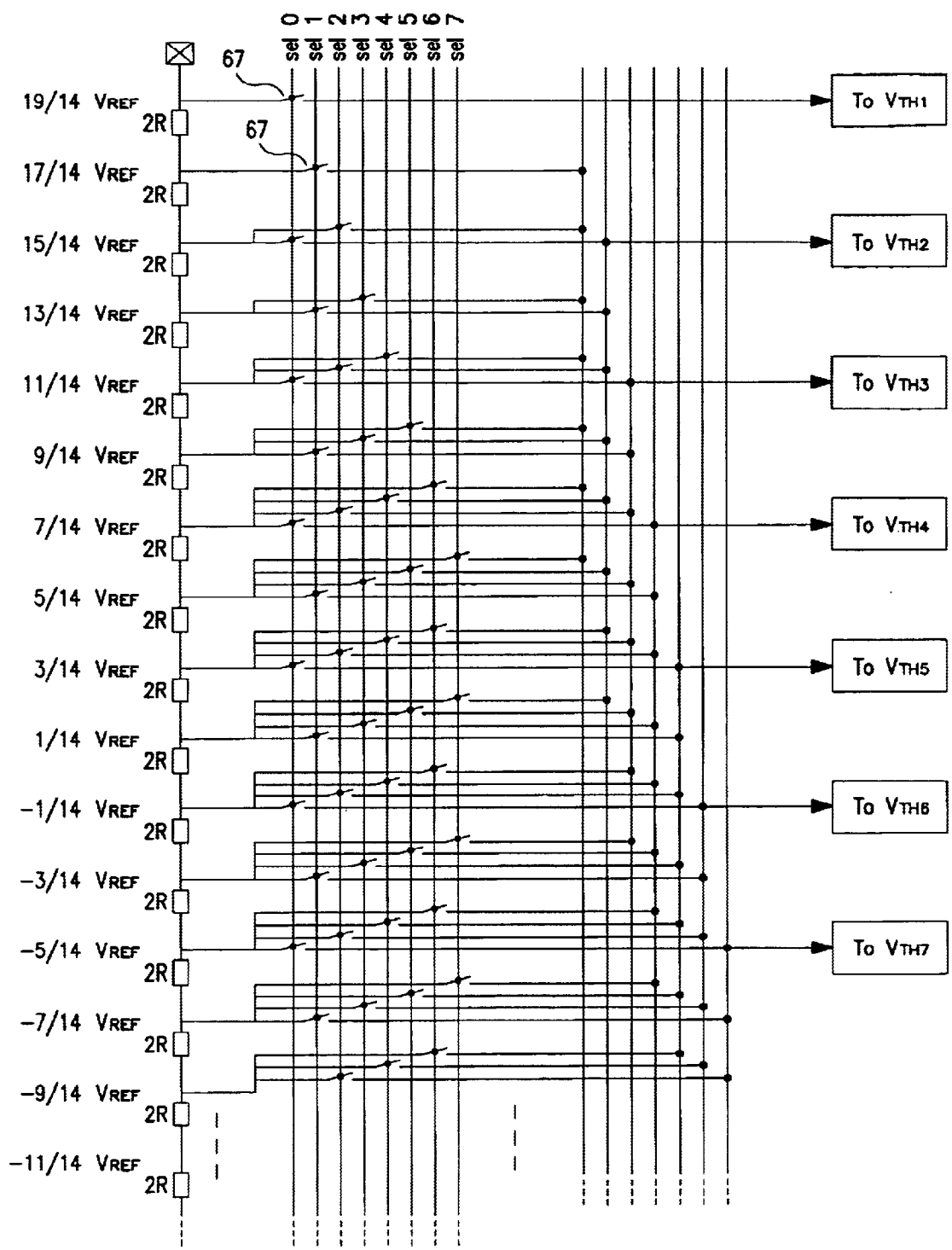
FIG. 8 shows an actual embodiment of the switching mechanism which switches the part reference voltages to the inputs of the comparators.

FIG. 8 shows in greater detail an exemplary embodiment of the circuit arrangement of a switching mechanism with the individual switches 67 for connecting the threshold voltages of the reference voltage generator to the reference voltage inputs $Vth_i$ of the comparators. Furthermore, for example, $b_3$ is selected as ½ (0.5) and the resolution is selected as three bits with seven threshold voltages.

In the tables shown in FIG. 9, it is explained how the results IN_DAC<0:6> of the previous weighting of the quantizer is combined with the switches 67 via the select lines se10 to se17.

Figure 10:
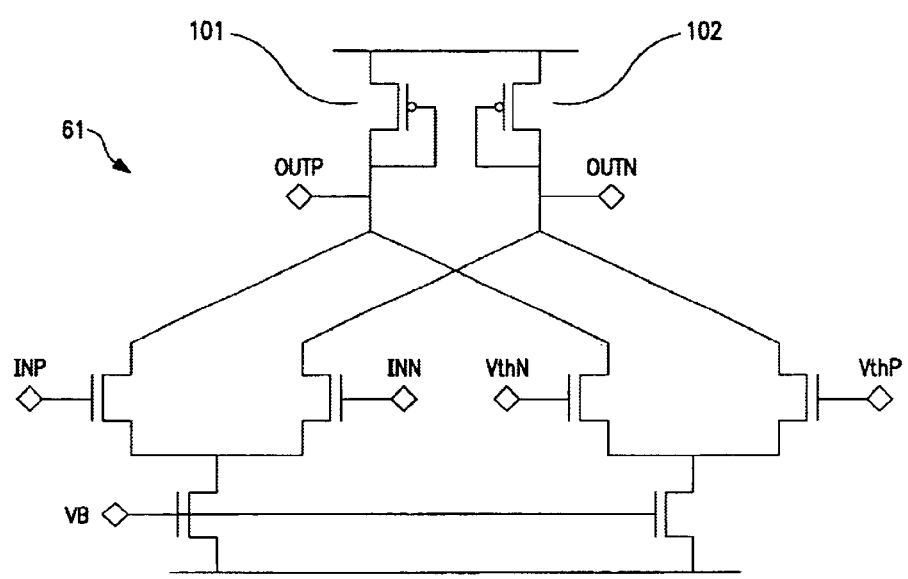
FIG. 10 shows a preferred embodiment of a comparator according to the invention.

FIG. 10 shows an example of the embodiment of the comparators 61 which are constructed as continuous-time voltage comparators according to the example shown. The diodes 101 and 102, respectively, are only provided as necessary load.

The values at the outputs OUTP and OUTN are equal only when the currents through the diodes 101 and 102 are equal. This, in turn, is only the case if INP+VthN=INN+VthP in all other cases, the currents through the diodes, and thus the values at the outputs OUTP and OUTN, are unequal.

Although the quantizer 1 according to the invention in accordance with the voltage summation principle with corresponding quantization cells is somewhat slower compared with the principle of current summation presented first, it is more accurate since the resistors used for generating the reference voltages can be produced with high accuracy. Furthermore, the solution using resistors needs less space on an integrated semiconductor and, therefore, can be implemented with higher resolution on the same area.

We claim:

1. A quantizer for a sigma delta modulator having at least one input stage providing an input signal to the quantizer, the quantizer quantizing the input signal, in accordance with at least one threshold signal and outputting the quantized input signal as a digital result value at a digital result output of the sigma delta modulator, characterized in that the quantizer contains at least one quantizing cell wherein the number of quantizing cells corresponds to the number of the resolution levels of the quantizer, each quantizing cell having an input voltage/current converter for converting the input signal to be quantized into a corresponding input signal current;

a static threshold current source is allocated to the at least one quantizing cell, the static threshold current source supplying a static component to the threshold signal in the form of a static threshold current wherein the quantizing cell comprises a dynamic feedback current source which generates an analog feedback current derived from the digital result value, wherein the analog feedback current is added to the static threshold current in a current node;

wherein the threshold current is composed of the static threshold current and the feedback current is added to the input signal current in the current node;

wherein the quantizing cell includes a comparison unit coupled to the current node for detecting whether the summed up current at the current node is not equal to zero and for outputting a digital quantizer cell result accordingly; and wherein the digital quantizer cell results form the digital result value.

2. The quantizer as claimed in claim 1, wherein the analog feedback current is derived from the digital result value by a digital/analog converter supplying an analog voltage signal corresponding to the digital result value.

3. The quantizer as claimed in claim 2, wherein the digital/analog converter is constructed in such a manner that it supplies the analog feedback current directly as its analog output signal.

4. The quantizer as claimed in claim 1, wherein the input voltage/current converter is a transistor driven at a base input by means of the input signal.

5. The quantizer as claimed in claim 1, wherein each quantizing cell is allocated a threshold signal which differs from the threshold signals of other quantizing cells.

6. The quantizer as claimed in claim 1, wherein the threshold signals exhibit fixed differences with respect to one another.

7. The quantizer as claimed in claim 1, wherein an amplifying stage is provided which amplifies the current at the current node before it is fed to the comparison unit.

8. The quantizer as claimed in claim 1, wherein a latch is provided as comparison unit.

9. The quantizer as claimed in claim 8, wherein a degeneration resistor is provided between a positive and a negative signal path.

10. The quantizer as claimed in claim 1, wherein the latch comprises a comparator and a sample-and-hold device.

11. The quantizer as claimed in claim 1, wherein the quantizer is constructed symmetrically with a positive and a negative signal path and correspondingly with a positive signal input for a positive input signal and with a negative signal input for a negative input signal.

12. The quantizer as claimed in claim 1, wherein a separate static threshold current source is allocated to each quantizing cell.

13. A quantizer for a sigma delta modulator having at least one input stage providing an input signal to the quantizer, the quantizer quantizing input signal, in accordance with at least one threshold signal and outputting the quantized input signal as a digital result value to a digital result output of the sigma delta modulator, wherein the quantizer contains at least one quantizing cell, the number of quantizing cells corresponding to the number of the resolution levels of the quantizer, each quantizing cell comprising a voltage comparator which compares the input signal, present as an input signal voltage with an associated threshold signal voltage and, if the input signal voltage exceeds or drops below the threshold signal voltage, outputs a corresponding digital result bit, wherein the result bits form the digital result value, a digital adder being provided which adds the digital result value corresponding to last output of the comparators of the quantizer to each of the threshold signal voltages associated to the comparators by incrementing or decrementing the respective threshold signal voltages by partial voltages corresponding to the digital result value.

14. The quantizer as claimed in claim 13, wherein a threshold signal is allocated to each quantizing cell, the threshold signal being different from the threshold signals of other quantizing cells.

15. The quantizer as claimed in claim 13, wherein a reference voltage generator is provided which generates the threshold signal voltages, which are different for each voltage comparator, the threshold signal voltages being selectable in partial voltages.

16. The quantizer as claimed in claim 15, wherein the reference voltage generator comprises a chain of resistors.

17. The quantizer as claimed in claim 15, wherein a switching apparatus is allocated to the adder, the switching apparatus comprising switches, the switching apparatus having inputs to which the voltages of the reference voltage generator are supplied, and the switching apparatus having outputs which are connected to the inputs of the comparators for the threshold signal voltages, the switches being controlled by a control signal of the adder.

18. The quantizer as claimed in claim 17, wherein the reference voltage generator generates the partial voltages which can be added to the threshold signal voltages of the comparators in accordance with the digital result value by use of the switches.

19. The quantizer as claimed in claim 13, wherein the threshold signals exhibit fixed differences with respect to one another.

20. The quantizer as claimed in claim 13, wherein the quantizer is constructed symmetrically with a positive and a negative signal path and correspondingly with a positive signal input for a positive input signal and with a negative signal input for a negative input signal.

21. The quantizer as claimed in claim 13, wherein the comparators are formed by continuous-time voltage comparators.

22. The quantizer as claimed in claim 13, wherein a latch is provided which stores the result supplied by the comparators.

23. A sigma delta modulator having at least one input stage and having a quantizer as claimed in claim 13.

* * * * *